United States Patent [19]

Oku

[11] Patent Number: 5,222,072
[45] Date of Patent: Jun. 22, 1993

[54] LASER POWER CONTROL APPARATUS

[75] Inventor: Juntaro Oku, Numazu, Japan

[73] Assignee: Tokyo Electric Co., Ltd., Tokyo, Japan

[21] Appl. No.: 970,550

[22] Filed: Nov. 2, 1992

Related U.S. Application Data

[63] Continuation of Ser. No. 777,182, Oct. 16, 1991, abandoned.

[30] Foreign Application Priority Data

Oct. 17, 1990 [JP] Japan .................................. 2-276481

[51] Int. Cl.$^5$ .............................................. H01S 3/13
[52] U.S. Cl. ...................................................... 372/31
[58] Field of Search .............................. 372/29, 31, 38

[56] References Cited

U.S. PATENT DOCUMENTS 4,856,008 8/1989 Senma et al. ............................ 372/29
5,134,623 7/1992 Egawa et al. ............................ 372/31

FOREIGN PATENT DOCUMENTS 0287360 10/1988 European Pat. Off. .
0358171 3/1990 European Pat. Off. .

OTHER PUBLICATIONS

Patent Abstract of Japan, vol. 14, No. 248, May 28, 1990 Laser Light Quantity Control Device.

Primary Examiner—James W. Davie
Attorney, Agent, or Firm—Frishauf, Holtz, Goodman & Woodward

[57] ABSTRACT

A laser power control apparatus which comprises an exciting section for supplying a drive current to a laser oscillation device, a laser power controller for generating current designating data which is incremented and decremented in a binary order, first and second digital-/analog converters respectively assigned to lower digits and higher digits of the current designating data, for performing digital-to-analog conversion on the lower-digit data and the higher-digit data, a current setting section for setting a level for the drive current in accordance with the sum of output voltages of the first and second digital/analog converters. In the apparatus, the current setting section has circuit constants which cause the ranges of the drive current for sequential two values of the higher-digit data to be overlapped with each other by a predetermined amount, and the laser power controller has a circuit for limiting the range of the lower-digit data to compensate the overlap of the drive current ranges.

8 Claims, 7 Drawing Sheets

LASER POWER CONTROL APPARATUS

This application is a continuation of application Ser. No. 07/777,182, filed Oct. 16, 1991, now abandoned.

BACKGROUND OF THE INVENTION

1. Field of the Invention

This invention relates to a laser power control apparatus for controlling the power of a laser beam emitted from a laser oscillator, and more particularly it relates to a laser power control apparatus for a semiconductor laser device used as a light source in an electrophotographic printing device such as a laser printer or a laser facsimile terminal.

2. Description of the Related Art

Figure 1:
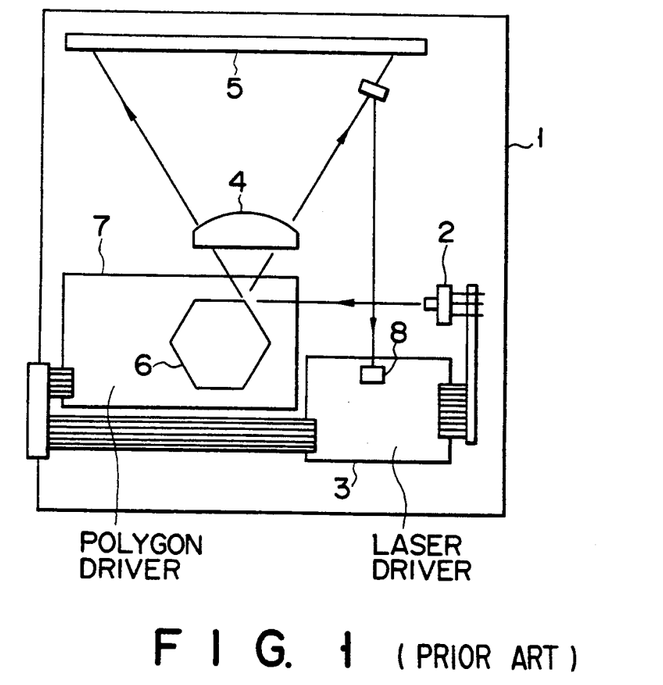
FIG. 1 is a plan view showing an internal structure of a light source unit of a typical electrophotographic printing device.

In a typical electrophotographic printing device, a surface of a photosensitive body is evenly charged with electricity, and then selectively exposed to a scanning laser beam to form an electrostatic latent image, which is subsequently developed into a visible image by a developing agent attached thereto. The developed image is transferred from the photosensitive body to a sheet of paper. This printing device comprises a light source unit 1 as illustrated in FIG. 1 for exposure of the photosensitive body surface. In this unit 1, a semiconductor laser device 2 is excited under the control of a laser driver to emit a laser beam and irradiate a polygon mirror 6. The polygon mirror is driven by a polygon driver 7 to rotate in the counter clockwise direction. The laser beam is reflected by the polygon mirror 6 and then directed to a reflector mirror 5 via a fθ lens 4, which mirror 5 reflects the laser beam and directed to the surface of the photosensitive body. The position of the reflector mirror 6 where the laser beam hits is changed in accordance with the angle of the polygon mirror 6, so that the surface of the photosensitive body is transversally scanned by the laser beam coming from the reflector mirror 5. A start sensor 8 detects a laser beam directed to an end of the photosensitive body from which scanning starts, and then generates a detection signal to be used for excitation control of the semiconductor laser device 2.

Figure 2:
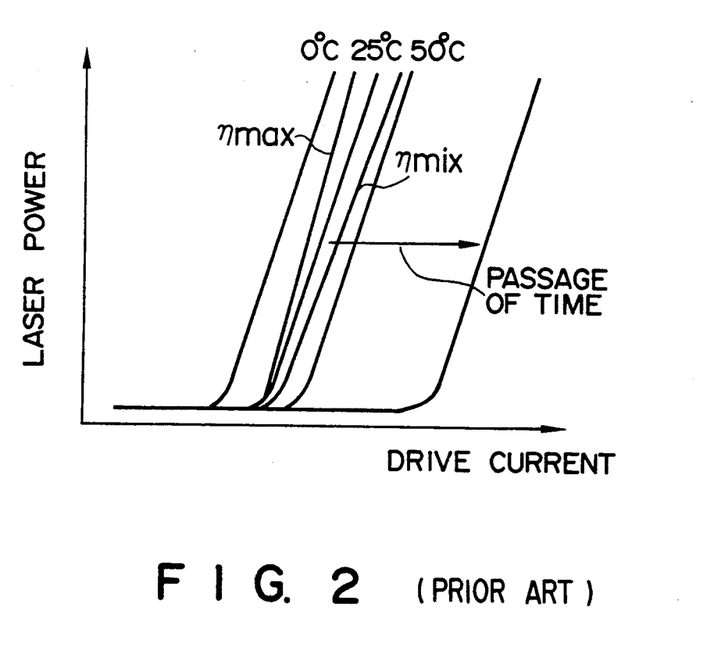
FIG. 2 is a graph showing the relationship between the drive current supplied to a semiconductor laser device and the power of a laser beam to be emitted therefrom.

FIG. 2 graphically shows the relationship between the drive current supplied to a semiconductor laser device 2 and the power of a laser beam to be emitted therefrom. The laser power is substantially proportional to the drive current beyond the threshold of the laser device 2, which may shift depending on the temperature of the device and the service time. The ratio of the change in drive current to the change in laser power, or differential efficiency η, can slightly vary depending on the manufacturing process of the semiconductor laser device 2 between a minimum limit ηmin and a maximum limit ηmax. The difference of inclination among the straight lines in FIG. 2 shows this fact. The laser driver 3 is generally designed to compensate any change in the laser power that can be caused by the difference in the condition which the semiconductor laser device 2 operates.

Figure 3:
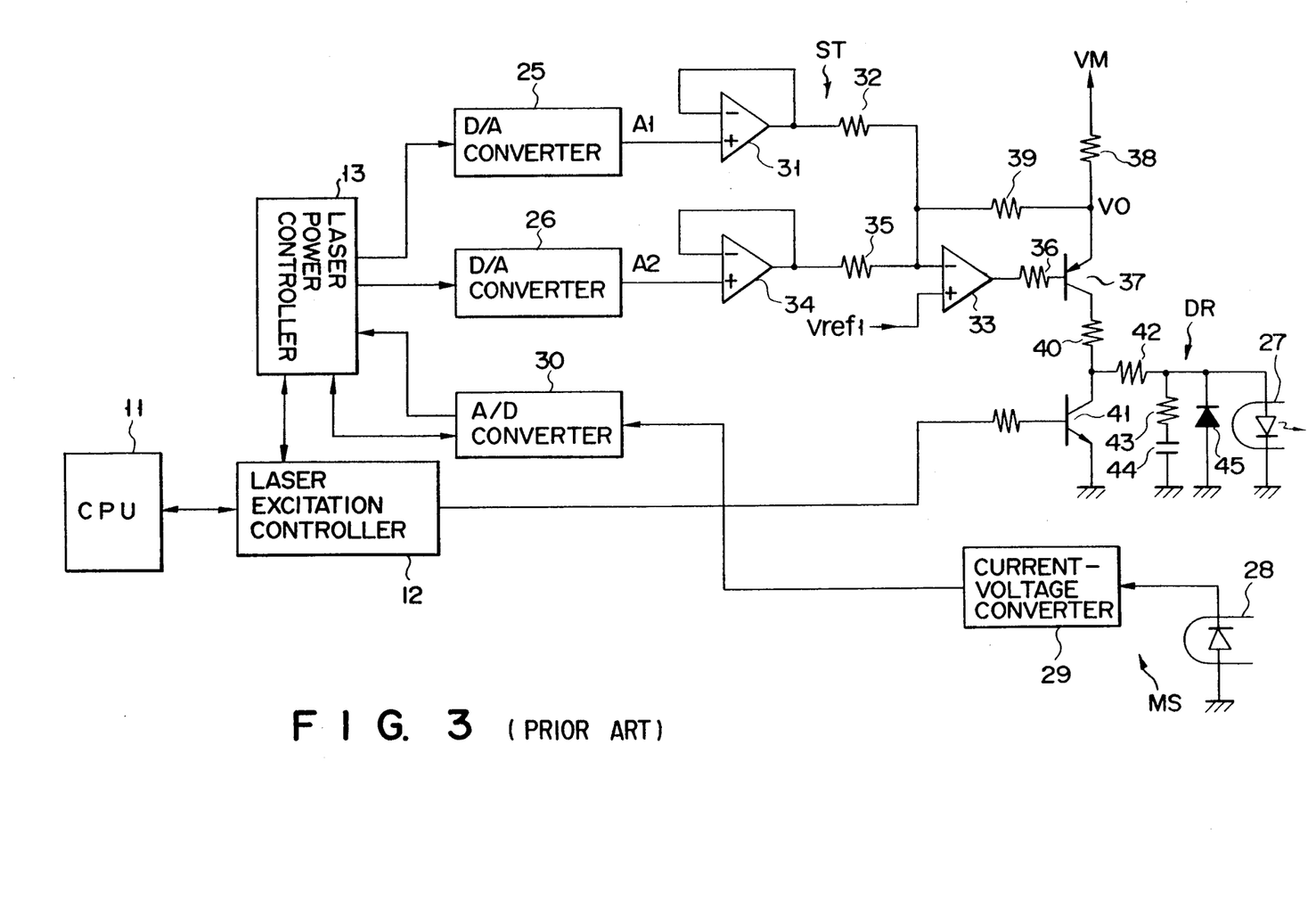
FIG. 3 is a circuit diagram schematically illustrating the configuration of a conventional laser driver used in the light source unit shown in FIG. 1.

FIG. 3 schematically illustrates the configuration of a conventional laser driver 3 which drives a laser diode 27 used as the semiconductor laser device 2. The printing device includes a control circuit for controlling all of the electrophotographic processing sections and producing print image data. The control circuit includes a CPU 11 which controls the laser driver 3 along with the polygon driver 7 and the start sensor 8 so as to expose the photosensitive body according to the print image data. The CPU 11 initially instructs the polygon driver 7 to rotate polygon mirror 6, instructs the laser driver 7 to drive the laser diode 27 after the rotation of the mirror 6 becomes stable at a preset speed, and then supplies a detection signal from the start sensor 8 and print image data to the laser driver 7.

The laser driver 3 includes a laser excitation controller 12, a laser power controller 13, a drive current setting section ST, a exciting section DR, and a laser power measuring section MS. The laser excitation controller 12 controls the exciting section DR so that the laser diode 27 is continuously made active when the scanning position is located outside the exposing span of the photosensitive body, and made active and inactive according to the print image data when the scanning position is located within the exposing span. The laser power controller 13 designates a level for the drive current to be supplied to the laser diode 27, based on the laser power measured by the laser power measuring section MS. The controller 13 supplies current-designating 10-bit data indicating the level thus designated, to the drive current setting section ST. The section ST changes the drive current in accordance with the laser power controller 13.

The drive current setting section includes first and second D/A (digital/analog) converters 25 and 26 which are assigned to the lower two bits and upper eight bits of the current designating data, and which perform D/A conversion on the lower 8-bit data and the upper 2-bit data. The analog output voltage A1 from the D/A converter 25 is supplied to the inversion input terminal (−) of an operational amplifier 33 by way of another operational amplifier 31 and a resistor 33. The analog output voltage A2 from the D/A converter is also supplied to the inversion input terminal (−) of the operational amplifier 33 by way of still another operational amplifier 34 and another resistor 35. A reference voltage Vref1 is supplied to the non-inversion input terminal (+) of the operational amplifier 33 The output terminal of the operational amplifier 33 is connected to the base of a PNP transistor 37 via a resistor 36. The emitter of the transistor 37 is connected to a power source terminal VM via a resistor 38 and to the inversion input terminal (−) of the operational amplifier 33. The collector of the transistor 37 is connected to the collector of an NPN transistor 41 via resistor 40. The emitter of the transistor 41 is connected to a ground terminal, and the base thereof is connected to the excitation controller 12 via a resistor. A resistors 42 and a laser diode 27 are connected in series with each other between the collector and emitter of the transistor 41. A diode 45 and a series circuit of a resistor 43 and capacitor 44 are connected in parallel with the laser diode 27.

The exciting section DR is constituted by the transistor 41, resistors 42, 43, capacitor 44, and diode 45. Transistor 37 performs an analog operation to generate an output current corresponding to the output voltage of the operational amplifier 33, and the transistor 41 performs a switching operation to selectively supply the output current from the transistor 37 to the laser diode 27 according to a control signal supplied from the laser excitation controller 12.

The laser power measuring section MS is constituted by a photodiode 28 for monitoring the power of a laser beam emitted from the laser diode 27, a current/voltage converter 29 for performing current-to-voltage conversion on the output current from the photodiode 28 to produce a monitor voltage, and an A/D converter 30 for performing analog-to-digital conversion on the monitor voltage from the current/voltage converter 30. The photodiode 28 is formed in the sam module as the laser diode 28.

Figure 4:
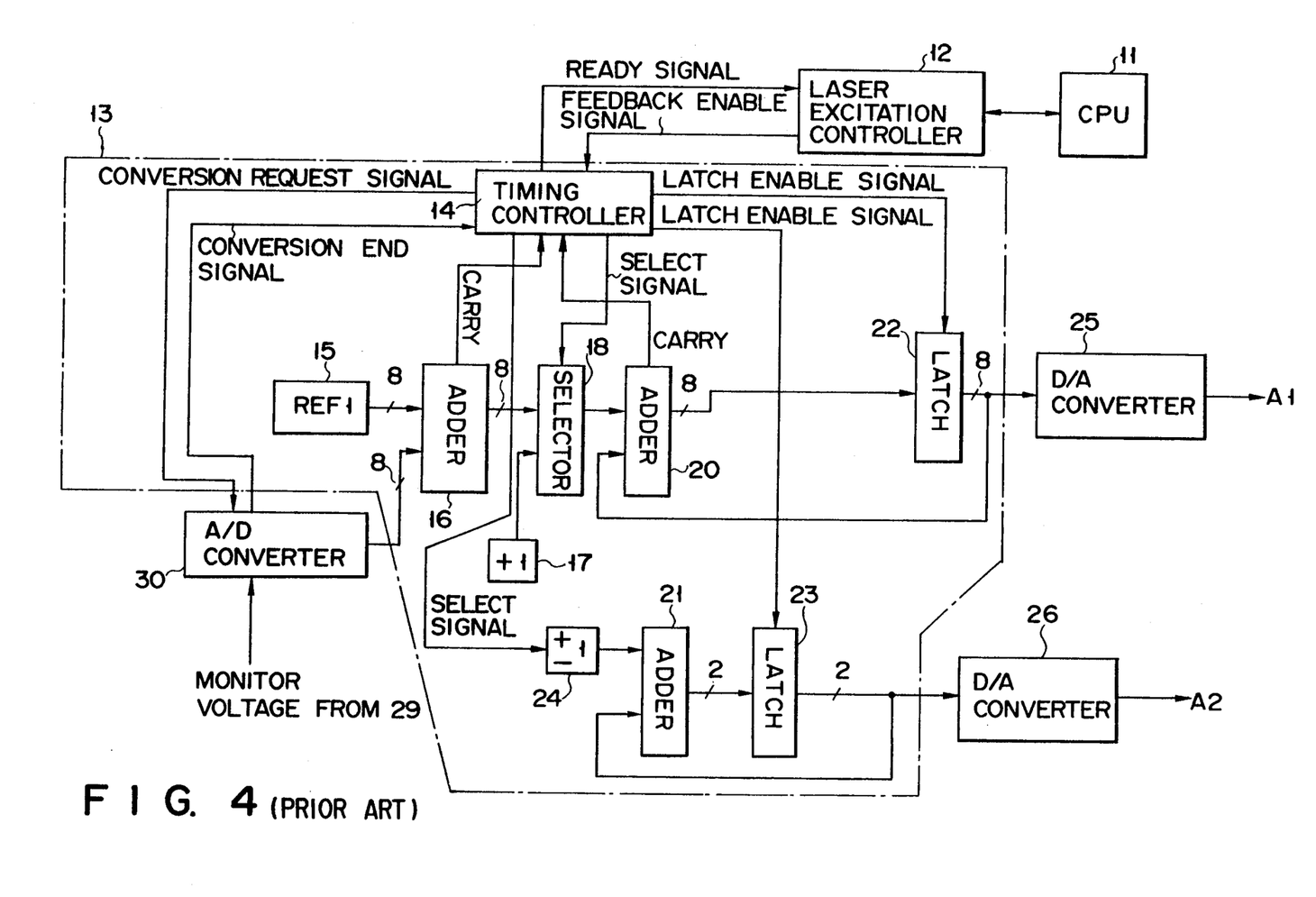
FIG. 4 is a circuit diagram showing in greater detail the configuration of a laser power controller shown in FIG. 3.
Figure 5:
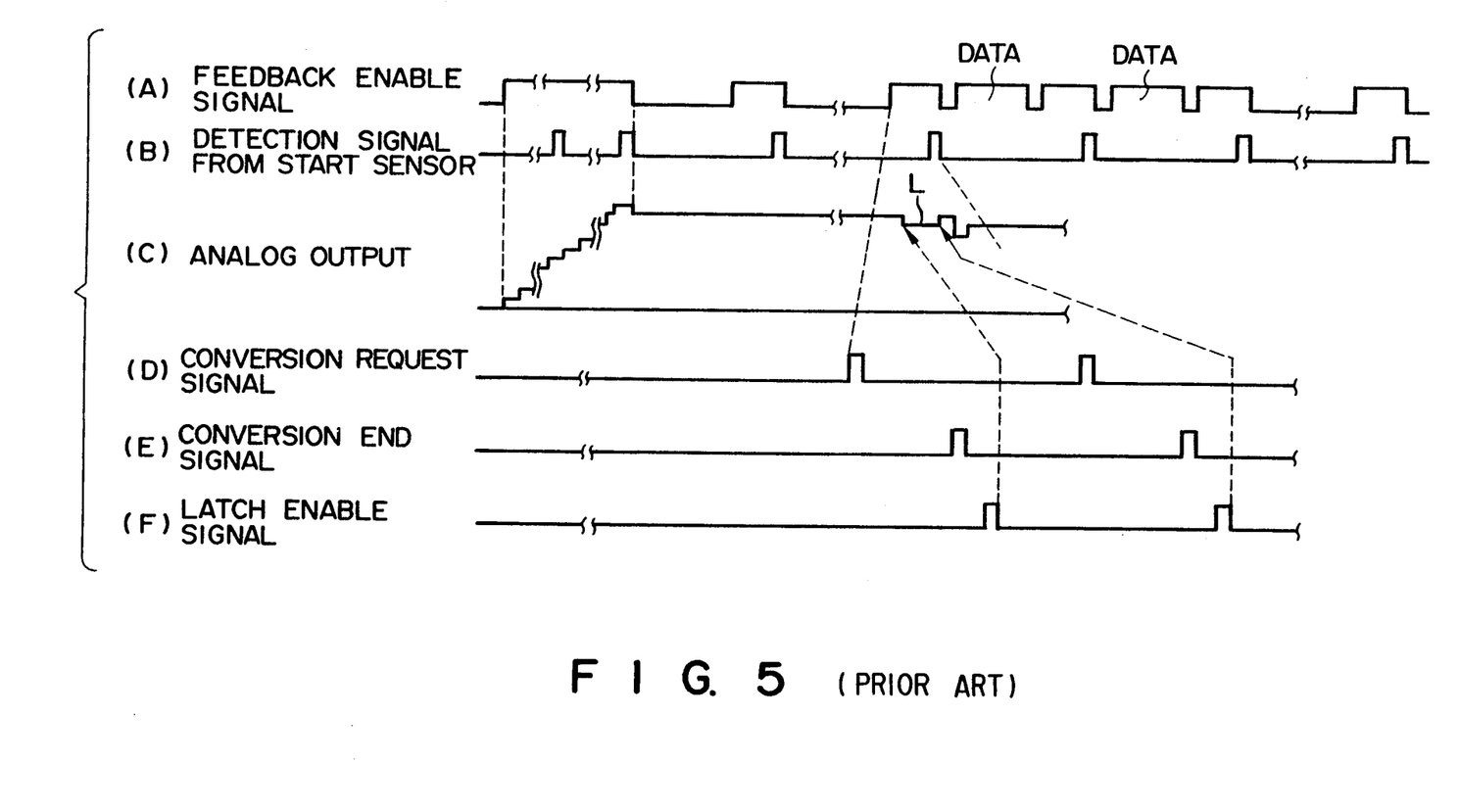
FIG. 5 is a time chart explaining an operation of the laser power controller shown in FIG. 4.

FIG. 4 shows in greater detail the configuration of the laser power controller 13, and FIG. 5 shows a time chart of the signals generated in the controller 13. The laser power controller 13 comprises a timing controller 14, adders 16, 20, and 24, selector 18, and latch circuits 21 and 22, and data generators 15, 17 and 24 for generating reference data REF1, increment data "1", increment/decrement data "+1" or "−1", for example.

In the laser driver 3 described above, if the input data to the D/A converter 15 is close to "00(H)" or "FF(H)", the adder 20 can be overflowed or underflowed when the monitor voltage is changed. (H denotes hexadecimal notation.) The timing controller 14 checks the carry outputs of the adders 16 and 20 to increase the input data to the D/A converter 26 by "1" when the overflow is occurred in the adder 20 and decrease the same by "1" when the underflow is occurred in the adder 20.

Figure 6:
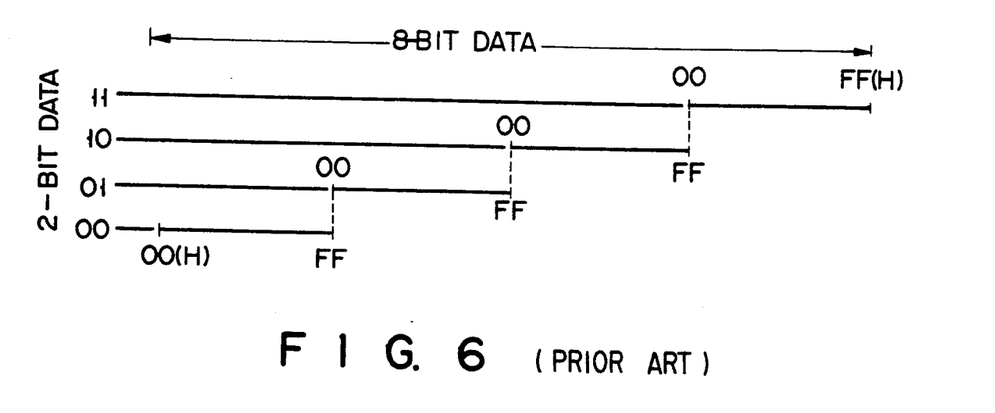
FIG. 6 is a chart showing a relationship between the input data to first and second D/A converters shown in FIGS. 3.

FIG. 6 shows a relationship between the input data to the D/A converter 25 and the input data to the D/A converter 26. The input data to D/A converter 25 is changed in a range from "00(H)" to "FF(H)" and the input data to the D/A converter 26 is changed in a range from "00" to "11", so that the current-designating 10-bit data is increased or decreased by a step change of "1". The laser drive current ILD and the emitter voltage VO of the transistor 37 are represented by the following equations:

$$ILD = (VM - VO)/R38 \text{ and}$$

$$VO = (1 + R39/R32 + R39/R35) Vref1 - R39/R32 \cdot A1 \cdot R39/R35 \cdot A2,$$

where
VM is the power source voltage,
A1 is the output voltage of the D/A converter 25,
A2 is the output voltage of the D/A converter 26,
Vref1 is the reference voltage supplied to the non-inversion input (+) of the operational amplifier 33,
R38 is the resistance of the resistor R38,
R39 is the resistance of the resistor R39,
R32 is the resistance of the resistor R32, and
R35 is the resistance of the resistor R35.

It will be understood from the equations that the drive current ILD depends on the output voltages of the D/A converters 25 and 26. Since the D/A converter 25 is of an 8-bit type, the following equation must be satisfied in order to linearly change the drive current ILD.

$$R39/R32 \cdot A1 : R39/R35 \cdot A2 \approx 1 : 1/256$$

Figure 7:
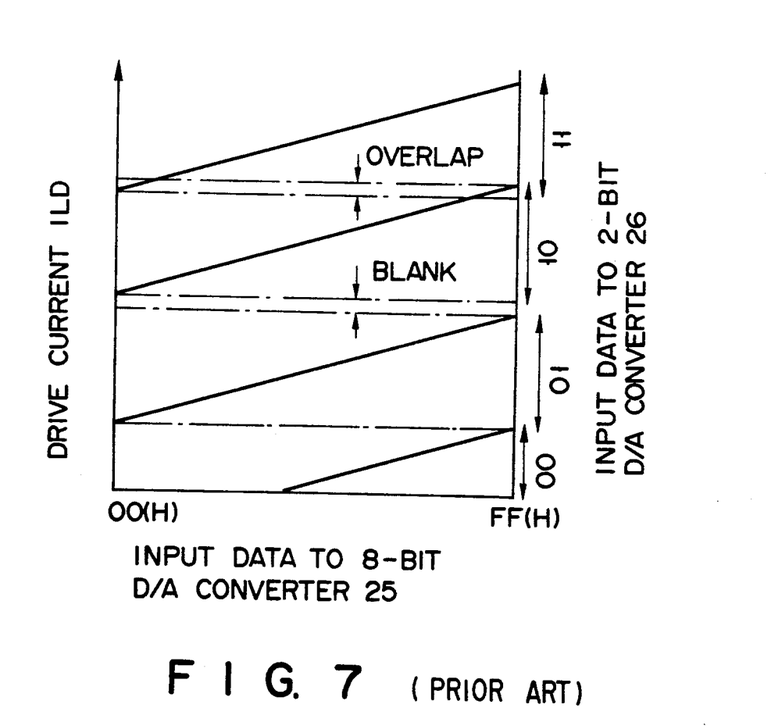
FIG. 7 is a graph explaining the non-linearity of a drive current supplied to a laser diode shown in FIG. 3.

However, it is difficult to prevent the resistances of the resistors R32, R35, and R39 and the step changes in the analog output voltages of the D/A converters 25 and 26 from being deviated from design values. Therefore, the linearity of the drive current ILD is impaired when the output voltages A1 and A2 are simultaneously changed as overflow or underflow occurs in the adder 20. FIG. 7 shows an overlap provided in the case where (R39/R32·A1)/(R39/R35·A2) > 1/256 and a blank provided in the case where (R39/R32·A1)/(R39/R35·A2) < 1/256. If the input data to the D/A converter 25 is constantly close to "00(H)" or "FF(H)", the input data to D/A converter 26 can be repeatedly increased and decreased by "1" upon change in the input data to the D/A converter 25. The drive current ILD extremely changes each time the input data to the D/A converter 26 is updated. This impairs the stability of the laser power.

SUMMARY OF THE INVENTION

An object of the present invention is to provide a laser power control apparatus capable of improving the linearity of a laser drive current which changes in accordance with the output voltages of two D/A converters.

According to the present invention, the object can be attained by a laser power control apparatus which comprises a current supplying circuit for supplying a drive current to a laser oscillation device, a data generating circuit for generating current designating data which is incremented and decremented in a binary order, first and second digital/analog converters respectively assigned to lower digits and higher digits of the current designating data, for performing digital-to-analog conversion on the lower-digit data and the higher-digit data, and a current setting circuit for setting a level for the drive current in accordance with the sum of output voltages of the first and second digital/analog converters, the current setting circuit having circuit constants which cause the ranges of the drive current for sequential two values of the higher-digit data to be overlapped with each other by a predetermined amount, and the data generating circuit having a circuit for limiting the range of the lower-digit data to compensate the overlap of the drive current ranges.

In the laser power control apparatus, the circuit constants of the current setting circuit cause the ranges of the drive current for sequential two values of the higher-digit data to be overlapped with each other by a predetermined amount. Therefore, the linearity of the drive current can be improved by determining the amount of overlap so as to absorb the shift of the drive current caused by circuit elements used for forming the first and second digital/analog converters and current setting circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An electrophotographic printing device according to an embodiment of the present invention will be described below with reference to the accompanying drawings. The printing device comprises a light source unit having the same configuration as that of FIG. 1 and a laser driver having the same configuration as that of FIG. 3. Therefore, the following description will concentrate on the configuration different from that of the prior art device. In the description and drawings of the embodiment, the components that are similar to those of FIGS. 1, 3, and 4 are indicated by the same reference symbols.

Figure 8:
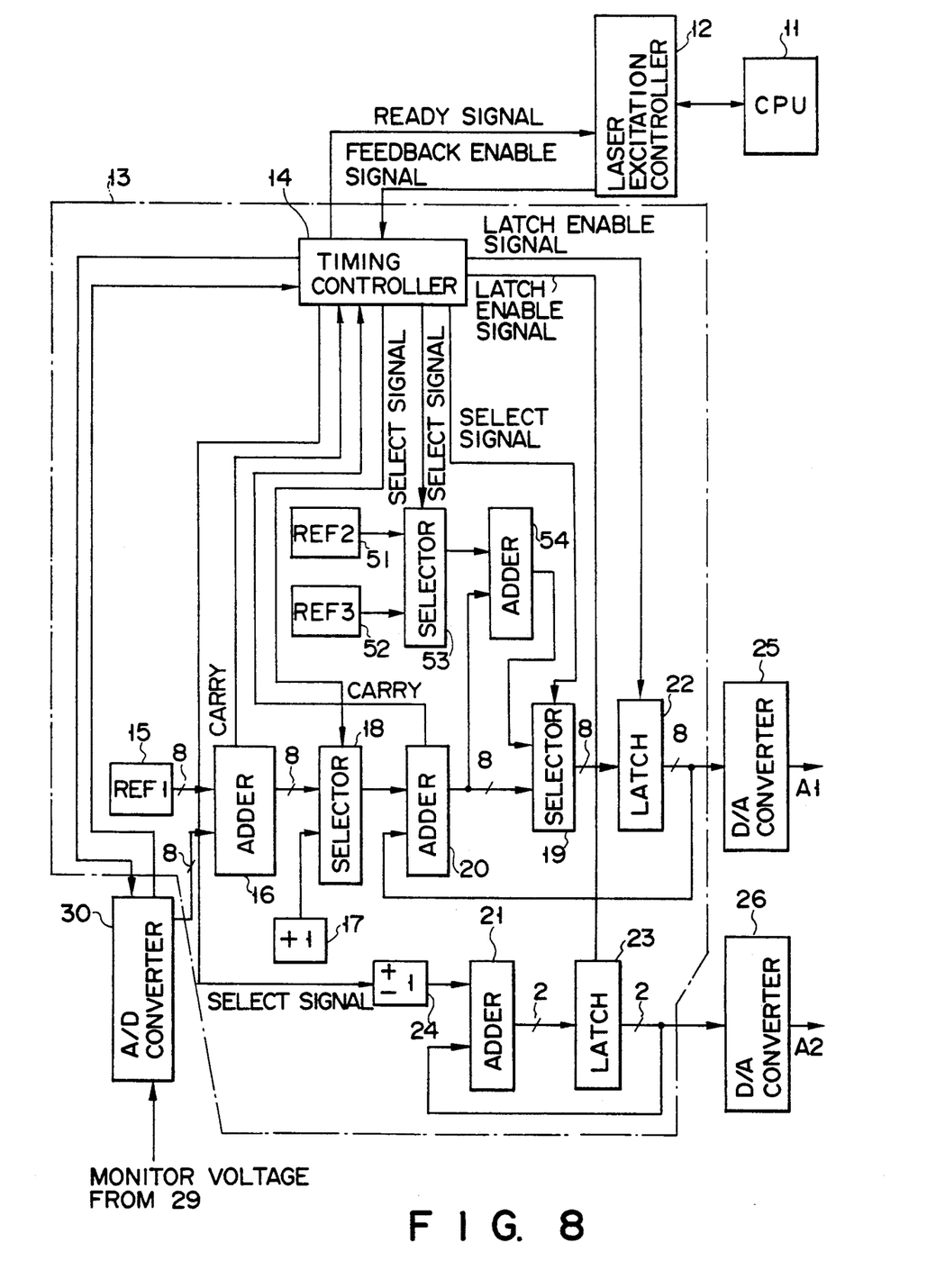
FIG. 8 is a circuit diagram illustrating the configuration of a laser power controller included in an electrophotographic printing device according to an embodiment of the present invention.

The laser driver of this embodiment includes a laser power controller 13 which differs from that shown in FIG. 4. FIG. 8 shows the configuration of this laser power controller 13. The laser power controller 13 has a data generator 15 for reference data REF1, an adder 16, a data generator 17 for increment data "+1", a selector 18, adders 20 and 21, latch circuits 22 and 23, and a data generator 23 for increment/decrement data "+1" or "−1", in the same manner as the conventional one. The laser power controller 13 further has a timing controller 14', data generators 51 and 52 for respectively generating reference data REF2 and REF3, a selector 53 for selecting one of the reference data REF2 and REF3 from the data generators 51 and 52, an adder 54 for adding the output data from the selector 53 with the output data from adder 20, and a selector 19 for selecting one of the output data from adders 20 and 54. The latch circuit 22 latches the output data from the selector 19. The timing controller 14' is similar to that shown in FIG. 4, and further supplies selection signals to the selectors 54 and 19.

In this embodiment, the laser drive current ILD and the emitter voltage VO of the transistor 37 are also represented by the following equations:

$$ILD = (VM - VO)/R38,$$

$$VO = (1 + R39/R32 + R39/R35)Vrefl - R39/R32 \cdot A1 - R39/R35 \cdot A2, \text{ and}$$

where

VM is the power source voltage,
A1 is the output voltage of the D/A converter 25,
A2 is the output voltage of the D/A converter 26,
Vrefl is the reference voltage supplied to the non-inversion input (+) of the operational amplifier 33,
R38 is the resistance of the resistor R38,
R39 is the resistance of the resistor R39,
R32 is the resistance of the resistor R32, and
R35 is the resistance of the resistor R35.

Moreover, the drive current setting section ST has circuit constants which cause the ranges of the drive current ILD for sequential two values of the higher-digit data to be overlapped with each other by a predetermined amount. For example, the following equation is satisfied:

$$R39/R35 \approx 240 \times R39/R32.$$

The reference data REF2 is set at "OF(H)" as a minimum value of the input data to the D/A converter 2 which is used to compensate the overlap when the drive current ILD is increased. The reference data REF3 is set at "FF(H)" as a maximum value of the input data to the D/A converter 25 which is used to compensate the overlap when the drive current ILD is decreased.

Next, the operation of the laser power controller 13 shown in FIG. 8 will be described below. In order to clarify the difference between this operation and that of the controller 13 shown in FIG. 4, assume that the controller does not have the data generators 51 and 52, the selectors 19 and 53, and the adder 20, and the latch circuit 22 is used to latch the output data of the adder 20. In this case, the controller 13 operates as follows.

Referring to FIG. 8, the latch circuits 22 and 23 respectively hold 8-bit data of zero and 2-bit data of zero in a initial state. When these data constitute lower eight bits and upper two bits of the current designating data and are supplied to the D/A converters 25 and 26, the laser drive current ILD is set at zero. Therefore, no laser beam is emitted from the laser diode 27 immediately after excitation thereof is enabled. At this time, monitor voltage of zero is supplied to the A/D converter 30. When the excitation of the diode 27 is enabled, a feedback enable signal is supplied to the timing controller 14'. The timing controller 14' supplies a conversion request signal to the A/D converter 30 in response to the feedback enable signal. The A/D converter 30 performs analog-to-digital conversion on the monitor voltage in response to the conversion request signal. Then, the A/D converter 30 supplies the resultant data to the adder 16 as conversion data, and a conversion end signal to the timing controller 14'. The adder 16 adds the conversion data to the reference data REF1 which is supplied from the data generator 15 as negative number data. If the conversion data exceeds the reference data REF1, a carry is supplied from the adder 16 to the timing controller 14'. The timing controller 14' supplies a selection signal to the selector 18 in response to the conversion end signal, and then a latch enable signal to the latch circuit 22. If no carry is generated from the adder 16, the data generator 17 is selected by the selection signal and the selector 18 outputs data "1" supplied from the data generator 17. The adder 20 adds output data from the selector 17 to data from the latch circuit 22, and the latch circuit latches output data from the adder 20.

The timing controller 14' repeatedly performs the above-described operation to increase the value of the data held in the latch circuit 22, until the adder 20 generates a carry. When the content of latch circuit 22 reaches "FF(H)" and adder 20 adds data "1" from the selector 17 to the data "FF(H)" from the latch circuit 22, a carry is supplied from the adder 20 to the timing controller 14'. At this time, the timing controller 14' supplies a selection signal to the data generator 24 to select increment/decrement data of "+1", and then supplies a latch signal to the latch circuit 23. The adder 21 adds data "+1" from the data generator 24 to data supplied from the latch circuit 23. The latch circuit 23 latches output data of the adder 21. In this way, the value of the data held in the latch circuit 23 increases one by one.

The timing controller 14' receives a carry from the adder 16 when the laser diode 27 has become available, and supplies a ready signal to the laser excitation controller 12. Thereafter, the selector 18 selects the adder 16 under the control of the timing controller 14'. The laser excitation controller 12 receives print image data from the CPU 11 after the ready signal is supplied from the timing controller 14', disables the excitation of the laser diode 27 after the start sensor 8 detects a laser beam as shown in FIG. 5(B), and then intermittently enables excitation of the laser diode 27 in accordance with the print image data. A feed back enable signal is supplied from the laser excitation controller 12 to the timing controller each time the excitation of the laser diode is enabled. In response to the feedback enable signal, the timing controller 14' controls the above-described components so that the drive current designating data is increased and decreased in accordance with the adder 16. In this control, the A/D converter 30 performs analog-to-digital conversion on a monitor voltage in response to a conversion request signal and supplies the resultant data to the adder 16 as conversion data. The adder 16 adds this conversion data to the reference data REF1 after a conversion end signal is generated from the A/D converter 30 as shown in FIG. 5(E). When the conversion data exceeds the reference data REF1, the selector 18 supplies the output data of the adder 16 to the adder 20 as negative number data. On the other hand, when the conversion data does not exceed the reference data REF1, the selector 18 supplies the output data of the adder 16 to the adder 20 as positive number data. The adder 20 adds the supplied data to data from the latch circuit 22. The timing controller 14' controls the data generator 24 to generate data "+1" when the adder 20 is overflowed, and to generate data "−1" when the adder 20 is underflowed. The adder 21 adds data from the data generator 24 to data from the latch circuit 23. The latch circuits 22 and 23 latches output data of the adders 20 and 22 in response to latch enable signals as shown in FIG. 5(F), so as to update the input data to the D/A converters 25 and 26. The sum of analog output voltages of D/A converters 25 and 26 changes as indicated by L in FIG. 5(C), for example.

After the exposing span of the photosensitive body is exposed to the laser beam emitted from the laser diode 27, the excitation of the laser diode 27 is enabled so that the start sensor 8 can detect the laser beam again. As a result, the start sensor 8 detects the laser beam at an interval determined by the rotation speed of the polygon mirror 6. The laser excitation controller 12 repeats the above-described operation in a cycle equal to the interval.

Next, it will be described in greater detail the operation of the laser power controller 13 after the laser diode 27 has become available. In the case where the laser power controller 13 does not have the data generators 51 and 52, the selectors 19 and 53, and the adder 20, and the latch circuit 22 is used to latch the output data of the adder 20, the input data to the D/A converter 25 changes in a range from "00(H)" to "FF(H)" in a state that the input data to the D/A converter 26 is "00", "01", "10", or "11" as shown in FIG. 6. The input data to the D/A converter 26 is updated each time the input data to the D/A converter 25 is updated from one of "00(H)" and "FF(H)" to the other. Upon update of the input data to the D/A converter 26, the laser drive current ILD extremely changes due to the circuit constants of the current setting section ST. This impairs the linearity of the drive current ILD.

In this embodiment, however, the laser power controller 13 has the data generators 51 and 52, the selectors 19 and 53, and the adder 20, and the latch circuit 22 is used to latch the output data of the selector 19. Therefore, the input data to the D/A converter 25 does not change in a range from "00(H)" to "FF(H)" in a state that the input data to the D/A converter 26 is "00", "01", "10", or "11".

Figure 9:
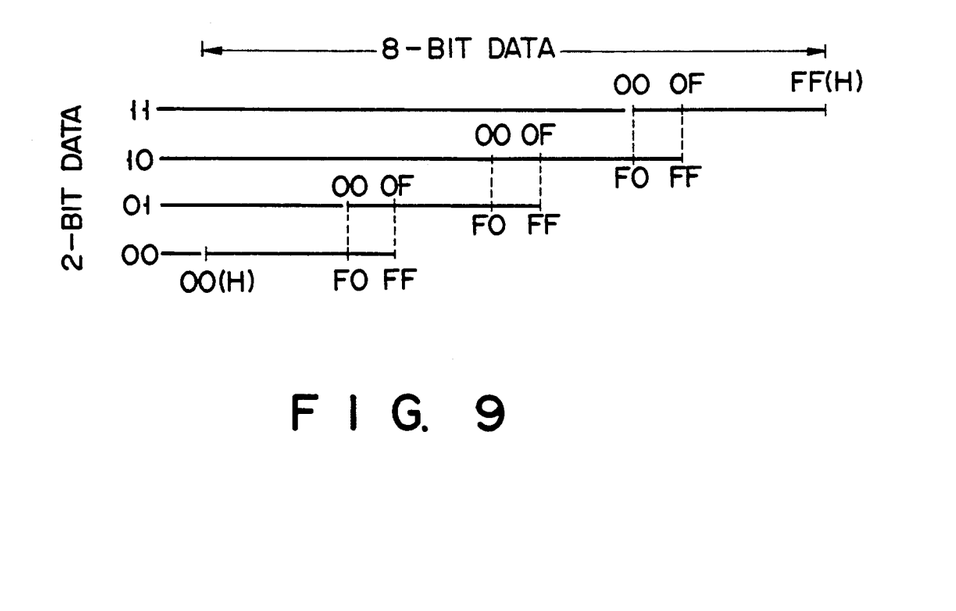
FIG. 9 is a chart showing a relationship between the input data to first and second D/A converters shown in FIG. 8.

FIG. 9 shows a relationship between the input data to the D/A converters 25 and 26 after the laser diode 27 has become available. The input data to the D/A converter 25 can be increased to "FF(H)" in a state that the input data to the D/A converter 26 is "00", for example. When the input data to the D/A converter 25 is further increased from "FF(H)" by "1", the input data to the D/A converter 26 is updated to "01". At this time, the input data to the D/A converter 25 is updated to "0F(H)" higher than "00(H)". On the other hand, the input data to the D/A converter 25 can be decreased to "00(H)" in a state that the input data to the D/A converter 26 is "01", for example. When the input data to the D/A converter 25 is further decreased from "00(H)" by "1", the input data to the D/A converter 26 is updated t o "00". At this time, the input data to the D/A converter 25 is updated to "F0(H)" lower than "FF(H)".

In order to control the input data to D/A converter 25 as described above, the timing controller 14' checks the carry outputs of the adders 16 and 20 to detects overflow and underflow of the adder 20. When the overflow is detected, the timing controller 14' controls the selector 53 to select the reference data REF2 from the data generator 51. When the underflow is detected, the timing controller 14' controls the selector 53 to selects the reference data REF3 from the data generator 52. Thus, the latch circuit 22 latches data of ("0F(H)" + the output data of the Adder 20) when the overflow is detected, and data of ("FF(H)"—the output data of the adder 20) when the underflow is detected. Accordingly, if the overflow is caused when the input data to the D/A converter 26 is "01" and the output data of the adder 20 is "01(H)", the input data to the D/A converter 25 is updated to "10(H)" (="0F(H)"+"01(H)"), and the input data to the D/A converter 26 is updated to "10". If the underflow is caused when the input data to the D/A converter 26 is "01" and the output data of the adder 20 is "01(H)", the input data to the D/A converter 25 is updated to "EF(H)" (="F0(H)"−"01(H)"), and the input data to the D/A converter 26 is updated to "00(H)".

Figure 10:
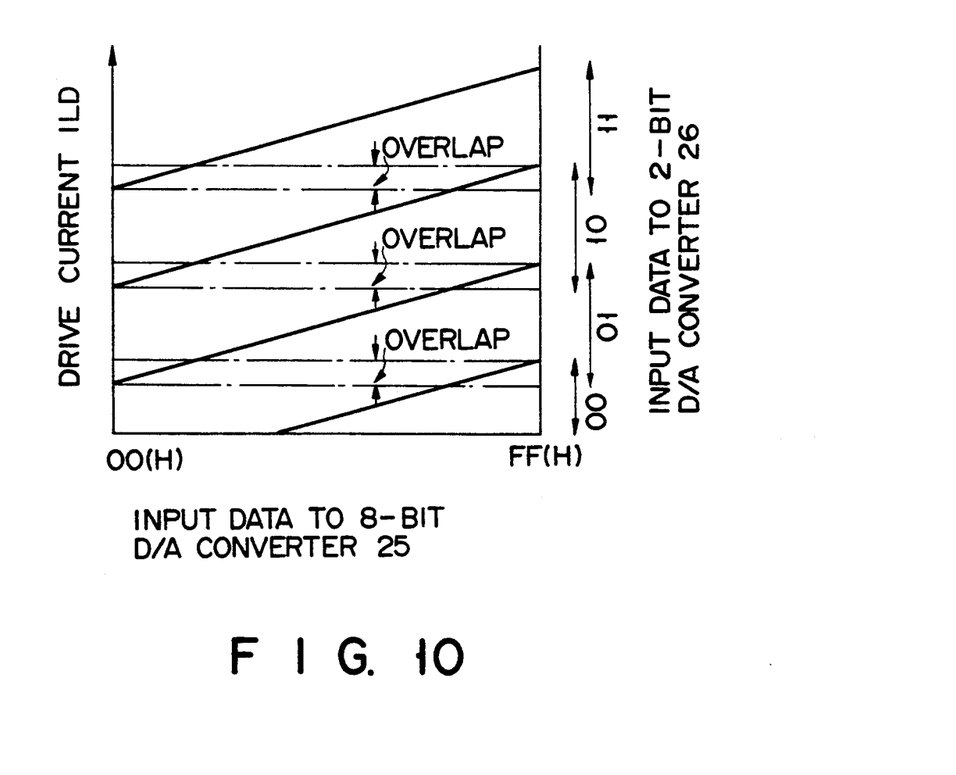
FIG. 10 is a graph explaining an operation for setting a drive current supplied to a laser diode.

In this embodiment, since $R39/R35 \approx 240 \times R39/R32$ is satisfied, ranges of the laser drive current ILD for the input data "00", "01", "10", and "11" overlap as shown in FIG. 10. However, the reference data REF2 is set at "0F(H)" as the maximum value of the input data to the D/A converter 25 used when the laser drive current ILD is decreased. Therefore, the overlap can be compensated. In other words, it is possible to linearly change the laser drive current ILD which is set by using two D/A converters 25 and 26.

The reference data REF2 and REF3 of this embodiment are set at "0F(H)" and "F0(H)". However, these values can be changed based on the amount of overlap actually measured. Further, the step change in the current designating data is not limited to "1". For example, it can be replaced by "2".

Additional advantages and modifications will readily occur to those skilled in the art. Therefore, the invention in its broader aspects is not limited to the specific details, and representative devices, shown and described herein. Accordingly, various modifications may be without departing from the spirit and scope of the general inventive concept as defined by the appended claims and their equivalents.

What is claimed is:

1. A laser power control apparatus comprising:
   current supplying means for supplying a drive current to a laser oscillation device;
   data generating means for generating current designating data which is incremented and decremented in a binary order;
   first and second digital/analog converting means respectively assigned to lower digits and higher digits of the current designating data, for performing digital-to-analog conversion on the lower-digit data and the higher-digit data; and
   current setting means for setting a level for the drive current in accordance with the sum of output voltages of said first and second digital/analog converting means, the current setting means having circuit constants which cause the ranges of the drive current for sequential two values of the higher-digit data to be overlapped with each other by a predetermined amount, and said data generating means including limiting means for limiting the range of the lower-digit data to compensate the overlap of the drive current ranges.

2. A laser power control apparatus according to claim 1, wherein said limiting means includes means for excluding values lower than a predetermined minimum value from a range in which the lower-digit data is updated for increasing the drive current.

3. A laser power control apparatus according to claim 2, wherein said limiting means further includes means for excluding values higher than a predetermined maximum value from a range in which the lower-digit data is updated for decreasing the drive current.

4. A laser power control apparatus according to claim 1, wherein said limiting means includes means for excluding values higher than a predetermined maximum value from a range in which the lower-digit data is updated for decreasing the drive current.

5. A laser power control apparatus according to claim 1, wherein said limiting means includes:
   a first data generator for generating a first reference data representing a predetermined maximum value;
   a second data generator for generating a second reference data representing a predetermined minimum value; and
   correcting means for adding one of the first and second reference data to the lower-digit data to concurrently update lower-digit and higher-digit data.

6. A laser power control apparatus according to claim 5, wherein said data generating means includes:
   a third data generator for generating a third reference data representing a reference power of a laser beam emitted from said laser oscillation device;
   monitor means for monitoring the power of the laser beam actually emitted from said laser oscillation device to generate an output data corresponding to the power; and
   updating means for updating the current designating data to reduce a difference between the third reference data and the output data of said monitor means.

7. A laser power control apparatus according to claim 6, wherein said updating means includes:
   a first adder for detecting a difference between the first reference data and the output data of said monitor means;
   first and second latching circuit assigned to the lower digits and higher digits of the current designating data for latching the lower-digit data and the higher-digit data, respectively;
   a second adder for adding the output data of said first adder to data supplied from said first latching circuit to output a result of the addition as the lower-digit data;
   a fourth data generator for generating unit data for increment and decrement upon overflow and underflow of said second adder, respectively, and
   a third adder for adding the output data of said fourth data generator to data supplied from said second latching circuit to output a result of addition as the higher-digit data.

8. A laser power control apparatus according to claim 7, wherein said correcting means includes:
   a first selector for selecting the first reference data upon overflow of said second adder and second reference data upon underflow of the second adder;
   a fourth adder for adding the output data of said first selector to the output data of said second adder; and
   a second selector for selecting the output data of said second adder upon absence of overflow and underflow of said second adder and the output data of said fourth adder upon presence of overflow and underflow of said second adder.

* * * * *